(12) United States Patent
Higashida et al.

(10) Patent No.: US 6,738,853 B1
(45) Date of Patent: May 18, 2004

(54) INTEGRATED CIRCUIT WITH BUILT-IN PROCESSOR AND INTERNAL BUS OBSERVING METHOD

(75) Inventors: Motoki Higashida, Tokyo (JP); Masaru Hagiwara, Hyogo (JP)

(73) Assignees: Renesas Technology Corp., Tokyo (JP); Mitsubishi Electric System LSI Design Corporation, Itami (JP)

( * ) Notice: Subject to any disclaimer, the term of this patent is extended or adjusted under 35 U.S.C. 154(b) by 0 days.

(21) Appl. No.: 09/663,337

(22) Filed: Feb. 9, 2000

(30) Foreign Application Priority Data

Aug. 4, 1999 (JP) .............................. 11-220953

(51) Int. Cl.[7] .......................... G06F 13/00; G01R 31/28

(52) U.S. Cl. .......................................... 710/305; 712/32

(58) Field of Search ........................... 710/305, 13, 62, 710/74; 712/32, 38; 714/10, 25, 42; 711/100; 340/825, 286.01

(56) References Cited

U.S. PATENT DOCUMENTS

| | | | |
|---|---|---|---|
| 4,777,355 A | * | 10/1988 | Takahira |
| 5,317,711 A | * | 5/1994 | Bourekas et al. |
| 5,572,665 A | * | 11/1996 | Nakabayashi |
| 5,784,637 A | * | 7/1998 | Sawase et al. |

FOREIGN PATENT DOCUMENTS

| | | |
|---|---|---|
| JP | 2-208785 | 8/1990 |
| JP | 5-197638 | 8/1993 |
| JP | 5-346869 | 12/1993 |
| JP | 6-214819 | 8/1994 |
| JP | 7-325733 | 12/1995 |
| JP | 10-232793 | 9/1998 |

* cited by examiner

Primary Examiner—Gopal C. Ray
(74) Attorney, Agent, or Firm—Burns, Doane, Swecker & Mathis, L.L.P.

(57) ABSTRACT

An LSI with built-in CPU includes a CPU core, an internal CPU bus connected to the CPU core, an external memory access-use external pin for accessing an external memory and a bus selector for outputting signals of the internal CPU bus to the external memory access-use external pin when the external memory is not being accessed.

6 Claims, 8 Drawing Sheets

INTEGRATED CIRCUIT WITH BUILT-IN PROCESSOR AND INTERNAL BUS OBSERVING METHOD

FIELD OF THE INVENTION

The present invention relates to an integrated circuit with built-in processor having a processor, an internal bus connected with the processor and an external output terminal for accessing an external memory, and relates to an internal bus observing method in the integrated circuit with built-in processor. More specifically, this invention relates to an integrated circuit with built-in processor and an internal bus observing method in the integrated circuit with built-in processor which outputs a signal of the internal bus to outside at the time of debug to observe the internal bus.

BACKGROUND OF THE INVENTION

In an integrated circuit with built-in processor, in order to verify functions and analyze an operation of the processor, it is important to observe the internal bus from outside at the time of debugging. There is an LSI with built-in CPU which is capable of observing the internal bus from the outside as the conventional integrated circuit with built-in processor. FIG. 8 is a block diagram showing a schematic configuration of an LSI with built-in CPU.

A conventional LSI with built-in CPU 51 is basically constituted so as to include a CPU core (processor) 52 for executing a process according to programs stored in an external memory 64, an SRAM 53, a DRAM 54, a DMAC (direct memory access controller) 55 for controlling direct memory access, a user logic 56 designed by a user, a peripheral I/O 57 for executing input/output for a peripheral device, a CSC (chip select controller) 58 for accessing the external memory 64, an internal CPU bus (internal bus) 59 for connecting these sections so that communication among the sections is possible, an external memory access-use external pin (external output terminal) 67 for accessing the external memory (an external memory) 64, an external memory access bus 60 for connecting the CSC 58 with the external memory 64 via the external memory access-use external pin 67 so that communication therebetween is possible, a chip select signal-use signal line 62 for a chip select signal outputted from the CSC 58 to the external memory 64, a test pin 66 for setting a function of the LSI with built-in CPU 51 to a mode for observing the internal CPU bus 59, a bus selector 61 for selecting signals of the internal CPU bus 59 or signals of the user logic 56 according to the setting of the test pin 66 so as to output the selected signals, and a logic analyzer (digital waveform observing unit) 65 for observing the signals of the internal CPU bus 59 outputted from the bus selector 61.

There will be described below the operation of this conventional LSI with built-in CPU 51. When the internal CPU bus 59 is to be observed, the LSI with built-in CPU 51 is first set to a mode for observing the internal CPU bus 59 by the test pin 66. As a result, the bus selector 61 selects the signals of the internal CPU bus 59. The signals of the internal CPU bus 59 are outputted from a user logic-use external pin and are observed by the logic analyzer 65. In this case, since the user logic-use external pin is used for observing the internal CPU bus 59, the function of the user logic 56 is limited.

Here, the signals of the internal CPU bus 59 may be outputted from another external pin such as a peripheral I/O-use external pin and observed. Also in this case, since the peripheral I/O-use external pin is used for observing the internal CPU bus 59, the function of the peripheral I/O 57 is limited. However, since the external memory access-use external pin 67 is required to be used for executing a program, the pin 67 is not used for observing the internal CPU bus 59.

However, according to the above conventional art, since the functions of the user logic 56 and the peripheral I/O 57 are limited, the internal bus cannot be observed when all the operating functions are actually executed. Therefore, there is a disadvantage that the suitable functions cannot be verified and the operation of the processor cannot be analyzed. Moreover, when the number of external output terminals other than the external output terminal for accessing the external memory is small, a number of terminals to be used for observing the internal bus is limited. As a result, the signals of the internal bus cannot be observed all at once, which is troublesome, and the cost rises.

SUMMARY OF THE INVENTION

The present invention has been made with such points in view. It is an object of the present invention to provide an integrated circuit with built-in processor and an internal bus observing method which are capable of observing an internal bus when all operating functions are actually operated and capable of verifying the suitable functions and analyzing an operation of the processor.

According to one aspect of this invention, an output unit outputs the signals of the internal bus to the external output terminal for accessing the external memory when the external memory is not being accessed, namely, at timing of intervals between the operations for accessing the external memory. As a result, it is not necessary to use external output terminals other than the external output terminal for accessing the external memory such as external output terminals for a user logic and a peripheral I/O for observing the internal bus.

Further, a delay unit is provided which delays the signals of the internal bus, and the output unit outputs the signals of the internal bus delayed by the delay unit to the external output terminal. As a result, even in the case where a cycle of accessing the external memory and a cycle of the internal bus are delayed (conflict with each other), the signals of the internal bus are delayed so as to be capable of being outputted by delayed time.

Further, a notification unit is provided which outputs a notification signal dedicated for notifying as to whether or not the external memory is being accessed, and the output unit outputs the signals of the internal bus to the external output terminal based on the notification signal outputted from the notification unit. As a result, since notifying is made as to whether or not the external memory is accessed, it is not necessary to input a signal for controlling the external memory such as a chip select signal to the output unit.

According to another aspect of this invention, a output step is provided in which the signals of the internal bus are outputted to the external memory access-use external output terminal when the external memory is not being accessed, namely, at timing of an interval between the external memory access operations, and a observation step is provided for observing the signals of the internal bus, which were outputted to the external output terminal in the output step. As a result, it is not necessary to use external output terminals other than the external memory access-use external output terminal such as external output terminals for the user logic and peripheral I/O for observing the internal bus.

Further, a delaying step is provided in which the signals of the internal bus are delayed, and in the output step the signals of the internal bus delayed in the delay step are outputted to the external output terminal. As a result, even in the case where the cycle of accessing the external memory and the internal bus cycle are delayed (conflict with each other), the signals of the internal bus are delayed by delayed time so as to be capable of being outputted.

Further, a notification step is provided in which a notification signal dedicated for notifying as to whether or not the external memory is accessed is outputted, and in the output step the signals of the internal bus are outputted to the external output terminal based on the notification signal outputted in the notification step. As a result, it is not necessary to use a signal for controlling the external memory such as a chip select signal in order to notifying as to whether or not the external memory is being accessed.

Other objects and features of this invention will become apparent from the following description with reference to the accompanying drawings.

DESCRIPTION OF THE PREFERRED EMBODIMENTS

There will be detailed below preferred embodiments of an integrated circuit with built-in processor and an internal bus observing method according to the present invention with reference to the drawings. However, this present invention is not limited to these embodiments.

Figure 1:
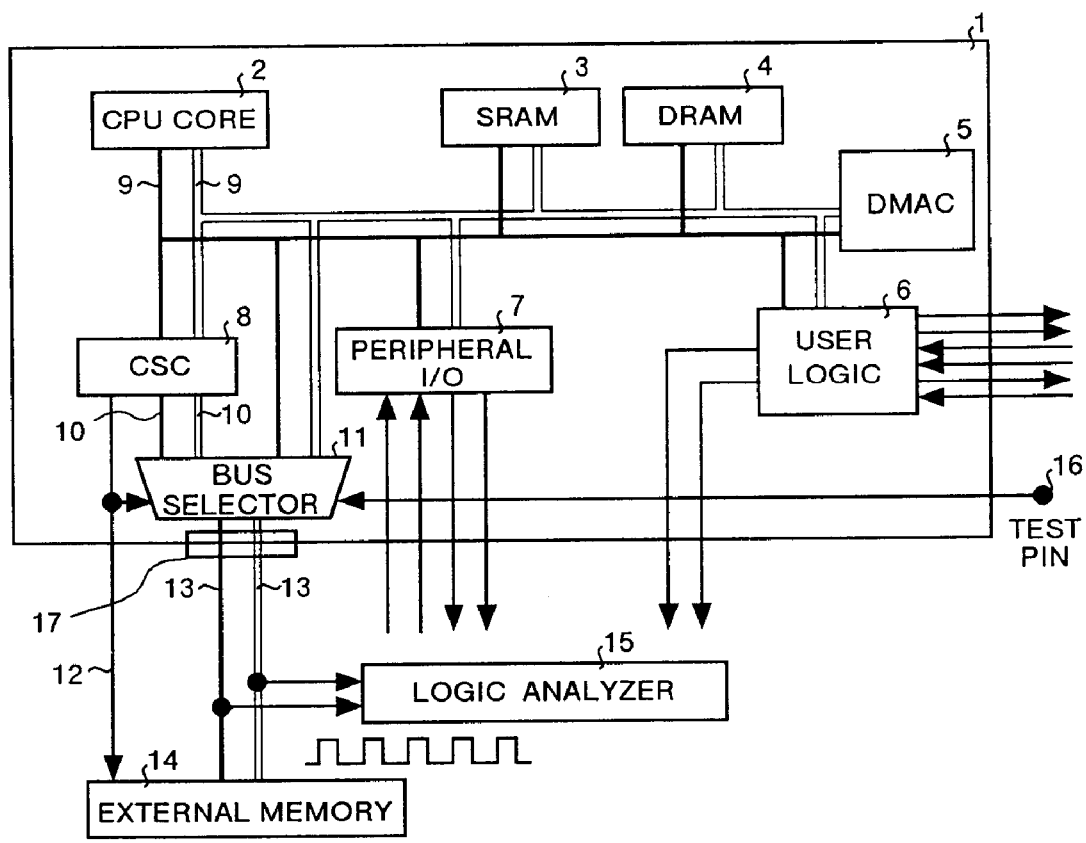
FIG. 1 is a block diagram showing a schematic structure of an LSI with built-in CPU according to a first embodiment of the present invention.

FIG. 1 is a block diagram showing a schematic structure of an LSI with built-in CPU according to the first embodiment of the present invention. The LSI with built-in CPU 1 according to the first embodiment includes a CPU core 2 for executing a process according to programs stored in an external memory 14, an SRAM 3, a DRAM 4, a DMAC 5 for controlling direct memory access, a user logic 6 designed by a user, a peripheral I/O 7 for executing input/output for a peripheral device, a CSC (chip select controller) 8 for accessing the external memory 14 (external memory access), an internal CPU bus 9 for connecting these sections so that communication among the sections is possible, an external memory access bus 10 for an output signal to the external memory 14 and an input signal from the external memory 14, a chip select signal-use signal line 12 for a chip select signal outputted from the CSC 8 to the external memory 14, a test pin 16 for setting a function of the LSI with built-in CPU 1 to an internal CPU bus monitor mode (a mode for observing the internal CPU bus 9), a bus selector 11 for selecting signals of the internal CPU bus 9 or signals of the external memory access bus 10 according to the chip select signal in the internal CPU bus monitor mode so as to output the selected signals, an external memory access/internal CPU bus monitor-use bus 13 for connecting the bus selector 11, the external memory 14 and a logic analyzer 15, and an external memory access-use external pin 17 for external memory access.

In this LSI with built-in CPU 1, the external memory access bus 10 is connected to the bus selector 11. On the other hand, an external pin, not shown, for the user logic is not connected with the bus selector, but directly coupled with a signal of the user logic 6 to be originally outputted. Namely, external pins other than the external memory access-use external pin 17 are directly coupled with signals to be outputted by actual operation. Signal of the internal CPU bus 9 outputted from the bus selector 11 are observed by the logic analyzer (digital waveform observing unit) 15 via the external memory access-use external pin 17.

When access to the external memory 14 is requested and it is writing access, the CSC 8 asserts a chip select signal to the external memory 14 and outputs a signal value of the internal CPU bus 9 onto the external memory access bus 10. On the other hand, when the request is reading access, the CSC 8 asserts the chip select signal to the external memory 14 and takes a signal value of the external data bus 10 into a data bus of the internal CPU bus 9. If access to the external memory 14 is not requested, the CSC 8 holds a final state at the time of the previous external memory access.

As for the operating function of the CSC 8, only when the external memory 14 is accessed, the external memory access bus 10 is occupied, and when the access is not executed, an idle state is obtained, and thus the external memory access bus 10 is not occupied. Namely, the external memory access-use external pin 17 is used only when the external memory 14 is accessed, and the external memory access-use external pin 17 is not used when the access is not executed. Therefore, a period in which the external memory 14 is not accessed can be allocated to observe the internal CPU bus 9, and thus the external memory access-use external pin 17 can be used. Monitoring setting of the internal CPU bus 9 is executed by setting the test pin 16.

This LSI with built-in CPU 1 corresponds to an integrated circuit with built-in processor, and the CPU core 2 corresponds to a processor of the present invention. The internal CPU bus 9 corresponds to an internal bus of the present invention, the external memory access-use external pin 17 corresponds to an external output terminal of the present invention, and the bus selector 11 corresponds to the output unit of the present invention.

Figure 2:
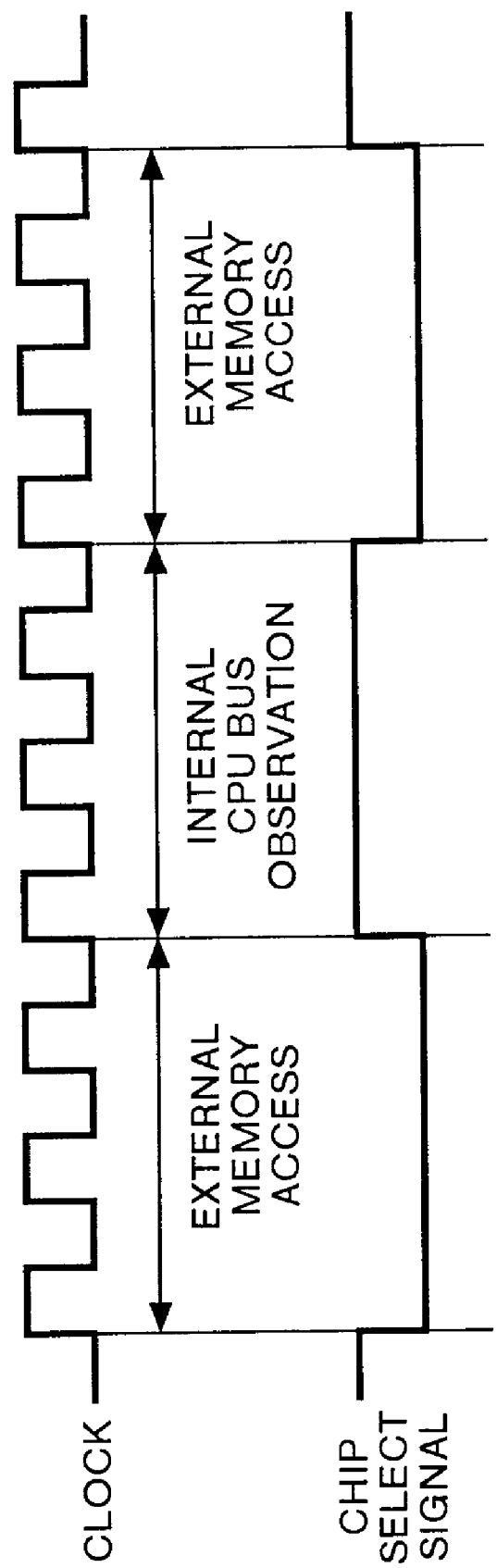
FIG. 2 is a timing chart showing an operation of the LSI with built-in CPU according to the first embodiment.

Operation of the first embodiment having the above structure will be described with reference to a timing chart. FIG. 2 is a timing chart showing the operation of the LSI with built-in CPU 1 according to the first embodiment when the internal CPU bus 9 is to be observed. In the operation of the LSI with built-in CPU 1 at the time of observing the internal CPU bus 9, the internal CPU bus monitor mode is first set via the test pin 16.

The bus selector 11 is operated according to the chip select signal supplied by the CSC 8 to the external memory 14. When the chip select signal is "low", namely, when the external memory access is executed, the bus selector 11 selects the signal of the external memory access bus 10 and outputs it. When the chip select signal is "high", namely, when the external memory access is not executed, the bus selector 11 selects the signal of the internal CPU bus 9 and outputs it. The outputted signal of the internal CPU bus 9 is analyzed by the logic analyzer 15.

In other words, utilizing the chip select signal it is controlled whether the signal of the external memory access bus 10 is to be outputted or the signal of the internal CPU bus 9 is to be outputted, and either one of the signals is outputted via the external memory access-use external pin 17. As a result, the internal CPU bus 9 can be observed at timing of an interval between periods that the external memory access is executed (external memory access period).

As mentioned above, according to the first embodiment, the signal of the internal CPU bus 9 can be outputted to the external memory access-use external pin 17, and the signal of the internal CPU bus 9 is outputted in the interval between the external memory access operations. As a result, since it is not necessary to use external pins other than the external memory access-use external pin 17 for observing the internal CPU bus 9, the internal CPU bus 9 can be observed when all the operating functions are actually operated, and thus the suitable functions can be verified and the operation of the CPU core 2 can be analyzed.

In addition, since the external memory access-use external pin 17 is used for observing the internal CPU bus 9, even in the case where a number of user logic-use external pins and peripheral I/O-use external pins are small, the signals of the internal CPU bus 9 can be observed all at once. As a result, the observation can be simplified and the cost can be reduced.

Figure 3:
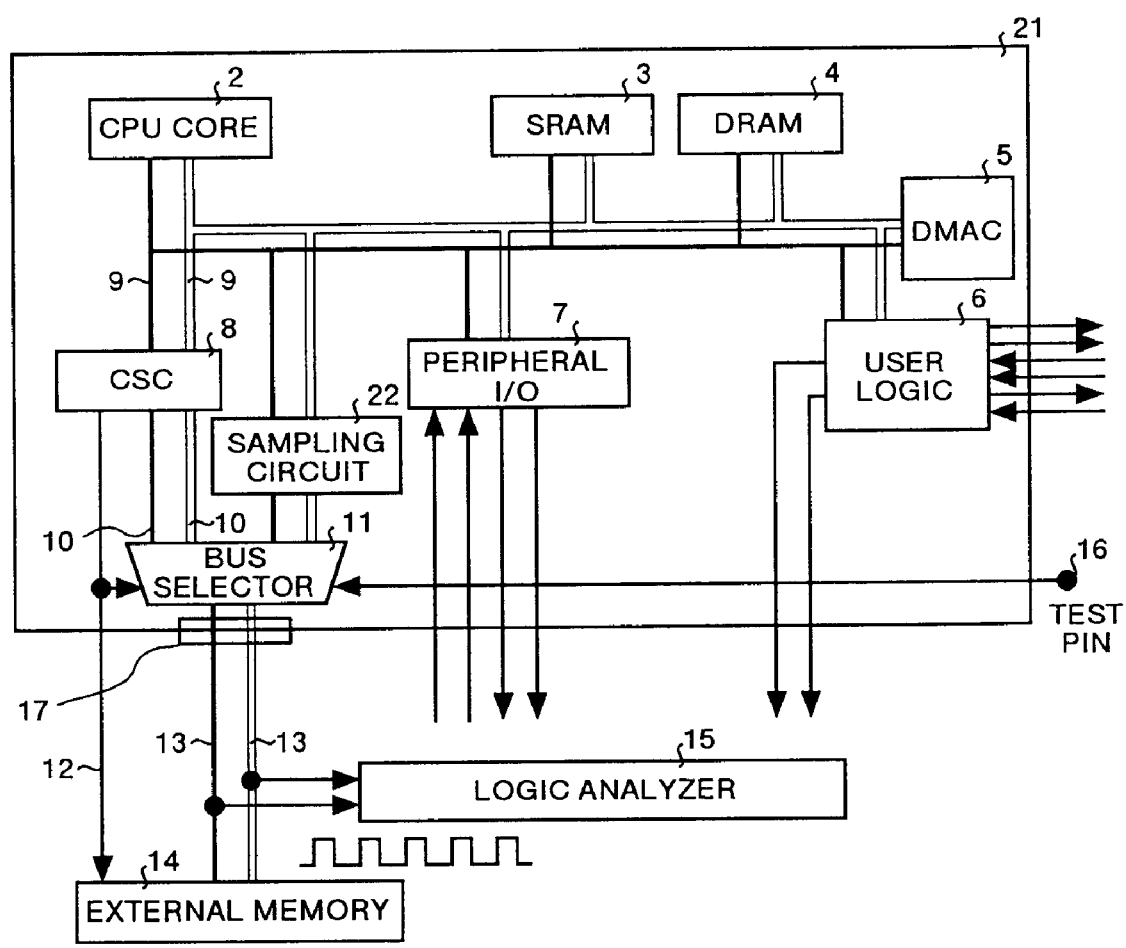
FIG. 3 is a block diagram showing a schematic structure of an LSI with built-in CPU according to a second embodiment of the present invention.

FIG. 3 is a block diagram showing a schematic structure of the LSI with built-in CPU according to the second embodiment of the present invention. Since the basic structure is the same as the structure of the first embodiment shown in FIG. 1, the same reference numerals are given to parts identical to those in FIG. 1, and the description thereof is omitted and only different parts will be described.

LSI with built-in CPU 21 according to the second embodiment includes a sampling circuit 22 having a flip-flop in addition to the structure of the first embodiment shown in FIG. 1. The sampling circuit 22 is positioned between the bus selector 11 and the internal CPU bus 9, and samples all the signals of the internal CPU bus 9 by means of the flip flop so as to output the signals of the internal CPU bus 9 which are delayed by 1 clock cycle to the bus selector 11. The bus selector 11 selects and outputs the signals of the internal CPU bus 9 delayed by 1 clock cycle or the signals of the external memory access bus 10. This sampling circuit 22 corresponds to the delay unit of the present invention.

Figure 4:
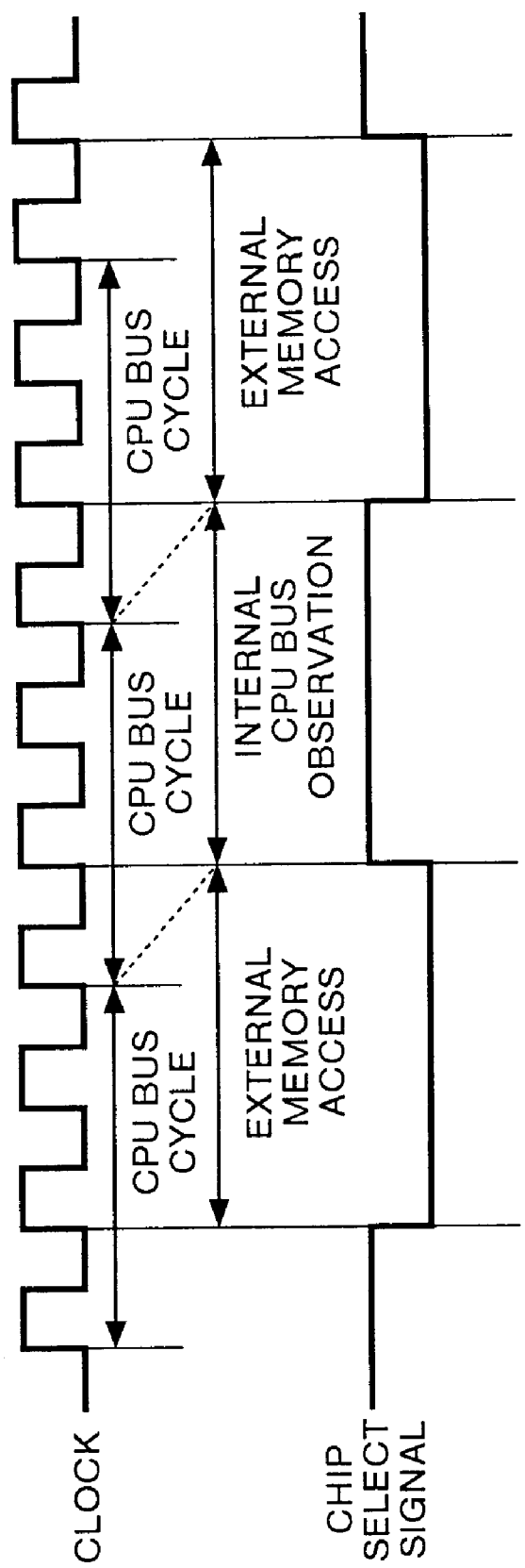
FIG. 4 is a timing chart showing the LSI with built-in CPU according to the second embodiment.

Operation of the second embodiment having the above structure will be described with reference to a timing chart. FIG. 4 is the timing chart showing the operation of the LSI with built-in CPU 21 according to the second embodiment. In the operation of the LSI with built-in CPU 21, an internal CPU bus cycle which is a cycle of the signals of the internal CPU bus 9 and an external memory access cycle which is a cycle with which the CSC 8 accesses the external memory 14 are delayed (conflict with each other).

This is because it is necessary to secure a holding time of chip enable/address/data at the time of access to the external memory 14 in the operation of the CSC 8, and even after the corresponding internal CPU bus cycle, the CSC 8 is continued to be operated for a constant period, for example, 1 clock (occupy the external memory access bus 10).

The sampling circuit 22 delays the signals of the internal CPU bus 9 by 1 clock cycle to output them. Namely, the sampling circuit 22 delays the signals of the internal CPU bus 9 by a length of the period in which the external memory access cycle and the internal CPU bus cycle conflict with each other so as to output them. The bus selector 11 outputs the signals from the sampling circuit 22 to the external memory access-use external pin 17 at the interval of the external memory access cycles. The signals of the internal CPU bus 9, which were outputted to the external memory access-use external pin 17, are observed by the logic analyzer 15.

As a result, the signals of the internal CPU bus 9 in portions where the external memory access cycle and the internal CPU bus cycle conflict with each other can be also observed. The timing of the signals of the internal CPU bus 9 to be observed is delayed by 1 clock cycle from the timing of the actual signals of the internal CPU bus 9. In other words, a phase error of 1 clock cycle occurs. However, according to a judgment based on a viewpoint of observing the internal CPU bus 9, since the phase error does not occur between the signals of the internal CPU bus 9, this is not worth considering.

As mentioned above, according to the second embodiment, the sampling circuit 22 delays the signals of the internal CPU bus 9 by the length of the period in which the external memory access cycle and the internal CPU bus cycle conflict with each other so as to output them, and the bus selector 11 outputs the signals of the internal CPU bus 9 which were delayed by the sampling circuit 22 to the external memory access-use external pin 17. As a result, the signals of the internal CPU bus 9 at the timing that the external memory access cycle and the internal CPU bus cycle conflict with each other can be also observed, and the more suitable functions can be verified and the operation of the CPU core 2 can be analyzed.

Figure 5:
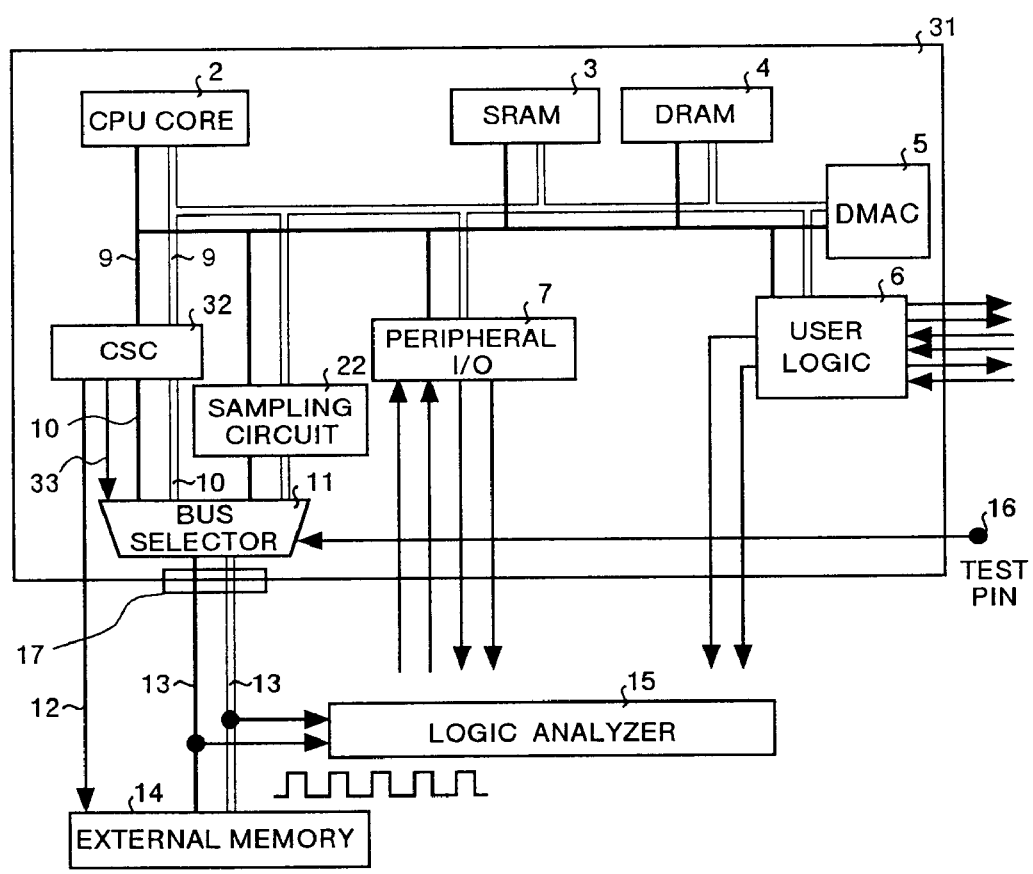
FIG. 5 is a block diagram showing a schematic structure of the LSI with built-in CPU according to a third embodiment of the present invention.

FIG. 5 is a block diagram showing a schematic structure of the LSI with built-in CPU according to the third embodiment of the present invention. Since the basic structure is the same as the structure according to the second embodiment shown in FIG. 3, the same reference numerals are given to the parts identical to those in FIG. 3 and the description thereof is omitted, and only the different portions will be described.

LSI with built-in CPU 31 according to the third embodiment includes a CSC 32 instead of the CSC 8 of the second embodiment shown in FIG. 3. In addition to the chip enable signal (chip select signal), the CSC 32 generates a notification signal for notifying as to whether or not the external memory 14 is accessed and outputs the notification signal to the bus selector 11. The bus selector 11 and the CSC 32 are connected with each other by a notification signal-use signal line 33 instead of the chip select signal-use signal line 12.

The bus selector 11 selects the signals of the internal CPU bus 9 or the signals of the external memory access bus 10 based on the notification signal from the CSC 32 so as to output the selected signals. As a result, since it is not necessary to draw out the chip select signal-use signal line 12 to the bus selector 11, the chip enable signal is prevented from being delayed and the access time of the external memory 14 is prevented being influenced. As a result, the hazard of influencing the actual operation of the LSI with built-in CPU 31 can be avoided.

Figure 6:
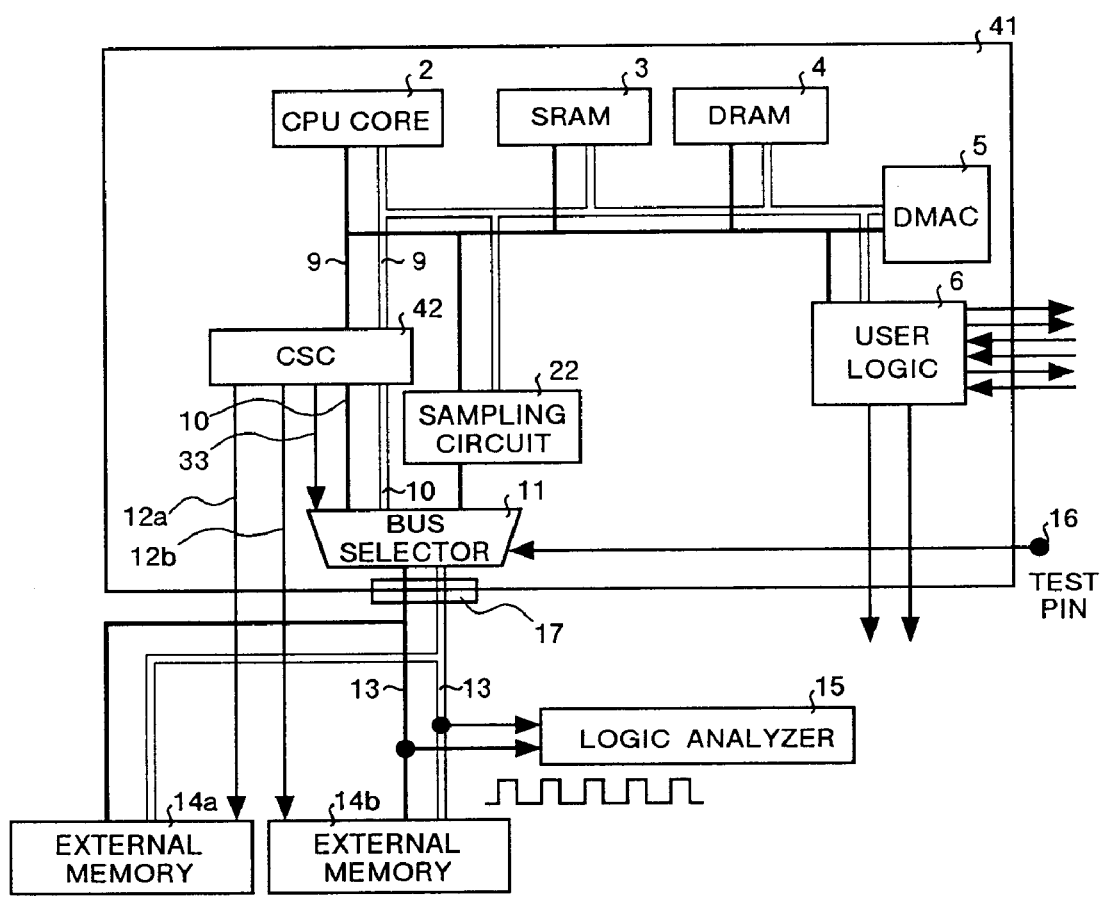
FIG. 6 is a block diagram showing a schematic structure of another LSI with built-in CPU according to the third embodiment of the present invention.

FIG. 6 is a block diagram showing a schematic structure of another LSI with built-in CPU according to the third embodiment. In this example, the LSI with built-in CPU 41 is connected with a plurality of external memories 14a and 14b. The CSC 42 is connected with the plurality of external memories 14a and 14b respectively by chip select signal-use signal lines 12a and 12b.

However, since the CSC 42 is connected with the bus selector 11 by the notification signal-use signal line 33, it is not necessary to output the chip enable signals, which are supplied to the external memories, to the bus selector 11, and thus the connection of a control signal with the bus selector 11 does not become complicated. In other words, it is not necessary to draw out the chip select signal-use signal lines to the bus selector 11, and thus the wiring can be simplified. Here, the CSC 32 and the CSC 42 correspond to the notification unit of the present invention.

Figure 7:
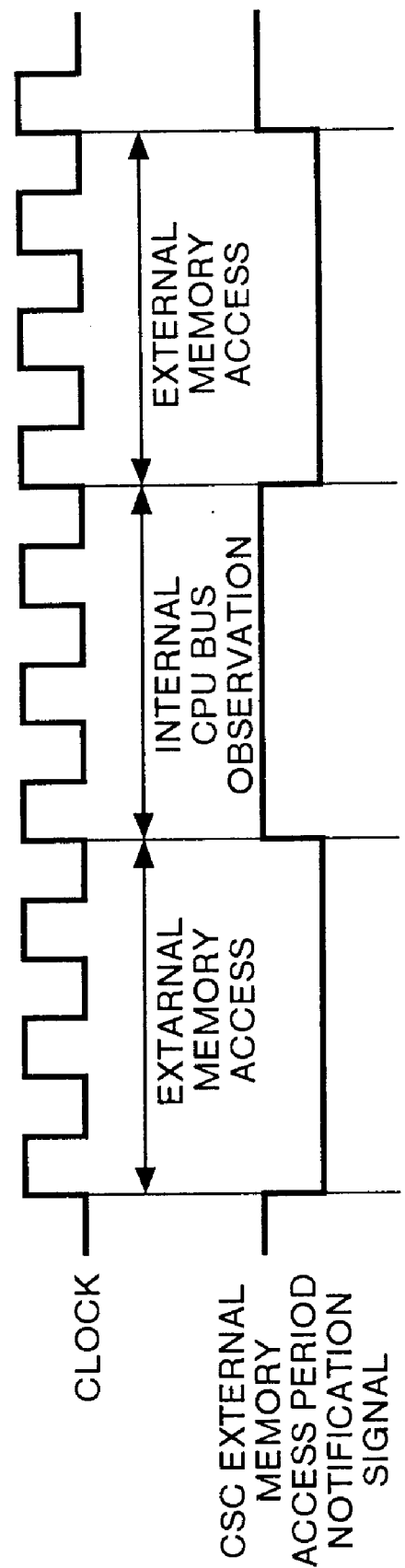
FIG. 7 is a timing chart showing an operation of the LSI with built-in CPU according to the third embodiment.
Figure 8:
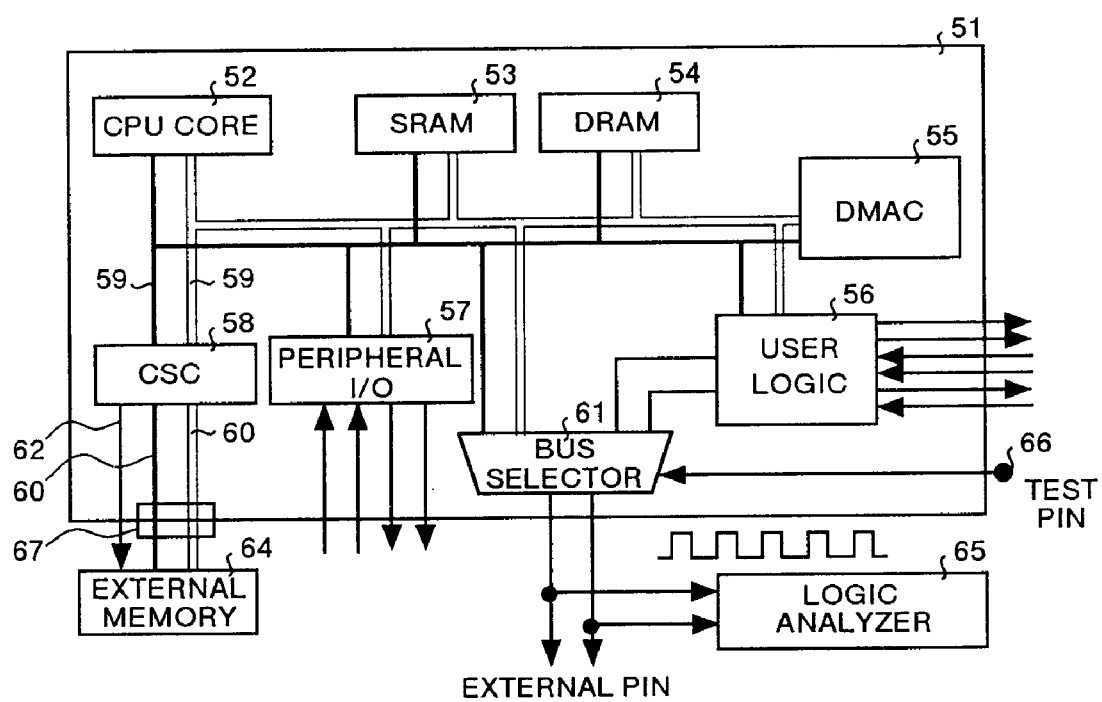
FIG. 8 is a block diagram showing a schematic structure of a conventional LSI with built-in CPU.

Operation of the third embodiment having the above structure will be described with reference to a timing chart. FIG. 7 is the timing chart showing the operation of the LSI with built-in CPU 31 according to the third embodiment. The notification signal for notifying the external memory access period is in a "low" level in the external memory access period and is in a "high" level in periods other than the external memory access period similarly to the chip select signal. The bus selector 11 outputs the signals from the sampling circuit 22 to the external memory access-use external pin 17 in the interval of the external memory access cycles. The signals of the internal CPU bus 9, which were outputted to the external memory access-use external pin 17 are observed by the logic analyzer 15.

As mentioned above, according to the third embodiment, the CSC 32 generates the notification signal for notifying as to whether or not the external memory 14 is accessed in addition to the chip select signal so as to output the notification signal to the bus selector 11. Since the chip select signal is not outputted to the bus selector 11, it is not necessary to delay the chip select signals, and thus the time that the external memory 14 is accessed is not influenced. Moreover, even if a plurality of external memories are used, it is not necessary at all to correct the connection of the control signal to the bus selector 11, and thus the cost can be reduced.

As explained above, according to this invention, the output unit outputs the signals of the internal bus to the external output terminal for accessing the external memory when the external memory is not being accessed, namely, at timing of intervals between the operations for accessing the external memory. Thus, it is not necessary to use external output terminals other than the external output terminal for accessing the external memory such as external output terminals for a user logic and a peripheral I/O for observing the internal bus. Therefore, there is the advantage that the internal bus can be observed when all functions are actually operated, and thus the suitable functions can be verified and the operation of the processor can be analyzed.

Further, the delay unit delays the signals of the internal bus, and the output unit outputs the signals of the internal bus delayed by the delay unit to the external output terminal. Thus, even in the case where a cycle of accessing the external memory and a cycle of the internal bus are delayed (conflict with each other), the signals of the internal bus are delayed so as to be capable of being outputted by delayed time. Further, the signals of the internal bus at the timing that the cycle of accessing the external storage unit and the internal bus cycle conflict with each other can be also observed, therefore, there is the advantage that more suitable functions can be verified and the operation of the processor can be analyzed.

Further, the notification unit outputs a notification signal dedicated for notifying as to whether or not the external memory is being accessed, and the output unit outputs the signals of the internal bus to the external output terminal based on the notification signal outputted from the notification unit. Since notifying is made as to whether or not the external memory is accessed, it is not necessary to input a signal for controlling the external memory such as a chip select signal to the output unit. Since it is not necessary to delay the chip select signals, there is the advantage that the operation of the integrated circuit with built-in processor can be made stable. Moreover, even if a plurality of the external memory are used, it is not necessary to input the respective chip select signals to the output unit, and there is the advantage that the circuit can be simplified and the cost can be reduced.

According to another aspect of this invention, in the output step the signals of the internal bus are outputted to the external memory access-use external output terminal when the external memory is not being accessed, namely, at timing of an interval between the external memory access operations, and in the observation step the signals of the internal bus, which were outputted to the external output terminal in the output step. As a result, it is not necessary to use external output terminals other than the external memory access-use external output terminal such as external output terminals for the user logic and peripheral I/O for observing the internal bus. Therefore, there is provided the advantage that the internal bus at the time of actually operating all the functions can be observed, and the suitable functions can be verified and the operation of the processor can be analyzed.

Further, in the delaying step the signals of the internal bus are delayed, and in the output step the signals of the internal bus delayed in the delay step are outputted to the external output terminal. As a result, even in the case where the cycle of accessing the external memory and the internal bus cycle are delayed (conflict with each other), the signals of the internal bus are delayed by delayed time so as to be capable of being outputted. Therefore, the signals of the internal bus at the timing that the cycle of accessing the external memory and the internal bus cycle conflict with each other can be also observed, and there is the advantage that more suitable functions can be verified and the operation of the processor can be analyzed.

Further, in the notification step the notification signal dedicated for notifying as to whether or not the external memory is accessed is outputted, and in the output step the signals of the internal bus are outputted to the external output terminal based on the notification signal outputted in the notification step. As a result, it is not necessary to use a signal for controlling the external memory such as a chip select signal in order to notifying as to whether or not the external memory is being accessed.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. An integrated circuit with built-in processor comprising:

a processor;

an internal bus connected to the processor;

an external output terminal which accesses an external memory;

an output unit which, when the external memory is not being accessed, selects signals of the internal bus, instead of an external memory access bus, and outputs the selected one of the signals to the external output terminal; and a delay unit which delays the signals of said internal bus, wherein said output unit outputs the signals of said internal bus delayed by said delay unit to said external output terminal.

2. The integrated circuit with built-in processor according to claim 1, further comprising:

a notification unit which outputs a notification signal dedicated for notifying as to whether or not said external memory is being accessed, wherein said output unit outputs the signals of said internal bus to said external output terminal based on the notification signal outputted from said notification unit.

3. An integrated circuit with built-in processor comprising:

a processor;

an internal bus connected to the processor;

an external output terminal which accesses an external memory;

an output unit which, when the external memory is not being accessed, selects signals of the internal bus, instead of an external memory access bus, and outputs the selected one of the signals to the external output terminal; and a notification unit which outputs a notification signal dedicated for notifying as to whether or not said external memory is being accessed, wherein said output unit outputs the signals of said internal bus to said external output terminal based on the notification signal outputted from said notification unit.

4. An internal bus observing method in an integrated circuit with built-in processor having a processor, an internal bus connected to the processor and an external output terminal for accessing an external memory, the internal bus observing method comprising the steps of:

selecting signals of the internal bus instead of an external memory access bus, when the external memory is not being accessed;

outputting the signals of the internal bus, to the external output terminal when the external memory is not being accessed;

observing the signals of said internal bus outputted to said external output terminal in said output step; and a delay step for delaying the signals of said internal bus, wherein in said output step, the signals of said internal bus delayed in said delaying step are outputted to said external output terminal.

5. The internal bus observing method according to claim 4, further comprising a notification step for outputting a notification signal dedicated for notifying as to whether or not said external memory is being accessed, wherein in said output step, the signals of said internal bus are outputted to said external output terminal based on the notification signal outputted in said notification step.

6. An internal bus observing method in an integrated circuit with built-in processor having a processor, an internal bus connected to the processor and an external output terminal for accessing an external memory, the internal bus observing method comprising the steps of:

selecting signals of the internal bus instead of an external memory access bus, when the external memory is not being accessed;

outputting the signals of the internal bus, to the external output terminal when the external memory is not being accessed;

observing the signals of said internal bus outputted to said external output terminal in said output step; and a notification step for outputting a notification signal dedicated for notifying as to whether or not said external memory is being accessed, wherein in said output step, the signals of said internal bus are outputted to said external output terminal based on the notification signal outputted in said notification step.

* * * * *